United States Patent
Maeda et al.

(10) Patent No.: US 8,941,345 B2
(45) Date of Patent: Jan. 27, 2015

(54) MULTI-SHAFT MOTOR DRIVE DEVICE AND MULTI-AXIS MOTOR DRIVE SYSTEM

(71) Applicant: Kabushiki Kaisha Yaskawa Denki, Kitakyushu (JP)

(72) Inventors: Takashi Maeda, Kitakyushu (JP); Takehisa Fukano, Kitakyushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 0 days.

(21) Appl. No.: 14/010,443

(22) Filed: Aug. 26, 2013

(65) Prior Publication Data

US 2013/0342152 A1   Dec. 26, 2013

Related U.S. Application Data

(63) Continuation of application No. PCT/JP2011/074766, filed on Oct. 27, 2011.

(30) Foreign Application Priority Data

Feb. 28, 2011   (JP) .................................. 2011-043027

(51) Int. Cl.

| *G05B 19/18* | (2006.01) |
|---|---|
| *H02P 31/00* | (2006.01) |
| *H02P 5/68* | (2006.01) |
| *H02K 11/00* | (2006.01) |
| *H02K 16/00* | (2006.01) |

(52) U.S. Cl.
CPC ..... *H02P 31/00* (2013.01); *H02P 5/68* (2013.01); *H02K 11/0073* (2013.01); *H02K 16/00* (2013.01)
USPC .......................................... 318/569; 318/600

(58) Field of Classification Search
USPC .......................... 318/625, 49, 112, 569, 600
See application file for complete search history.

(56) References Cited

U.S. PATENT DOCUMENTS

| 5,642,024 A | * | 6/1997 | Okada et al. | ................... 318/625 |
|---|---|---|---|---|
| 5,742,143 A | * | 4/1998 | Katagiri | ...................... 318/625 |
| 6,046,566 A | * | 4/2000 | Sonoda et al. | ................. 318/625 |
| 6,150,786 A | * | 11/2000 | Kinoshita et al. | ............. 318/564 |

(Continued)

FOREIGN PATENT DOCUMENTS

| JP | 2003-332526 | 11/2003 |
|---|---|---|
| JP | 2008-091684 | 4/2008 |

OTHER PUBLICATIONS

International Search Report for corresponding International Application No. PCT/JP2011/074766, Jan. 31, 2012.

(Continued)

*Primary Examiner* — Rina Duda
(74) *Attorney, Agent, or Firm* — Mori & Ward, LLP

(57) ABSTRACT

A multi-shaft motor drive device comprises at least one amplifier module, a control substrate, and a power substrate. The at least one amplifier module is configured to supply power to at least one motor. The control substrate connected with the amplifier module. The power substrate is connected with the amplifier module. The amplifier module comprises a switching element. The control substrate is provided with a signal line disposed for controlling the switching element according to a motor control instruction from a master controller. The power substrate is provided with a power line disposed for supplying power to the amplifier module. The control substrate and the power substrate are arranged separately each other.

6 Claims, 5 Drawing Sheets

(56) References Cited

U.S. PATENT DOCUMENTS

| | | | |
|---|---|---|---|
| 6,514,065 B2* | 2/2003 | Usui et al. | 425/162 |
| 6,671,573 B2* | 12/2003 | Nigazawa et al. | 700/193 |
| 7,119,505 B2* | 10/2006 | Komaki et al. | 318/113 |
| 7,194,321 B2* | 3/2007 | Sun et al. | 318/400.01 |
| 7,463,002 B2* | 12/2008 | Tanaka | 318/569 |
| 7,559,140 B2* | 7/2009 | Shimoike | 29/854 |

OTHER PUBLICATIONS

English translation of the Written Opinion of the International Searching Authority for International Application No. PCT/JP2011/074766, Jan. 31, 2012.

Japanese Office Action for corresponding JP Application No. 2012-525779, Oct. 2, 2012.

* cited by examiner

US 8,941,345 B2

MULTI-SHAFT MOTOR DRIVE DEVICE AND MULTI-AXIS MOTOR DRIVE SYSTEM

CROSS-REFERENCE TO RELATED APPLICATION

This is a continuation application PCT/JP2011/074766, filed Oct. 27, 2011, which was not published under PCT article 21(2) in English.

BACKGROUND OF THE INVENTION

1. Field of the Invention

The present disclosure relates to a multi-shaft motor drive device and a multi-axis motor drive system including the same.

2. Description of the Related Art

In prior arts, there has been known a multi-shaft motor drive device driving plural motors. This multi-shaft motor drive device of a prior art includes a base substrate and plural sub-substrates incorporated detachably to this base substrate.

SUMMARY OF THE INVENTION

According to one aspect of the present disclosure, there is applied a multi-shaft motor drive device comprising at least one amplifier module, a control substrate, and a power substrate. The at least one amplifier module is configured to supply power to at least one motor. The control substrate connected with the amplifier module. The power substrate is connected with the amplifier module. The amplifier module comprises a switching element. The control substrate is provided with a signal line disposed for controlling the switching element according to a motor control instruction from a master controller. The power substrate is provided with a power line disposed for supplying power to the amplifier module. The control substrate and the power substrate are arranged separately each other.

Further, according to another aspect of the present disclosure, there is applied a multi-axis motor drive system comprising at least one motor, a master controller, and a multi-shaft motor drive device. The master controller is configured to output a motor control instruction. The multi-shaft motor drive device is configured to drive the at least one motor according to the motor control instruction. The multi-shaft motor drive device includes at least one amplifier module, a control substrate, and a power substrate. The at least one amplifier module is configured to supply power to the at least one motor. The control substrate is connected with the amplifier module. The power substrate is connected with the amplifier module. The amplifier module comprises a switching element. The control substrate is provided with a signal line disposed for controlling the switching element according to a motor control instruction from a master controller. The power substrate is provided with a power line disposed for supplying power to the amplifier module. The control substrate and the power substrate are arranged separately each other.

DESCRIPTION OF THE EMBODIMENTS

Hereinafter, an embodiment will be explained with reference to the drawings.

Figure 1:
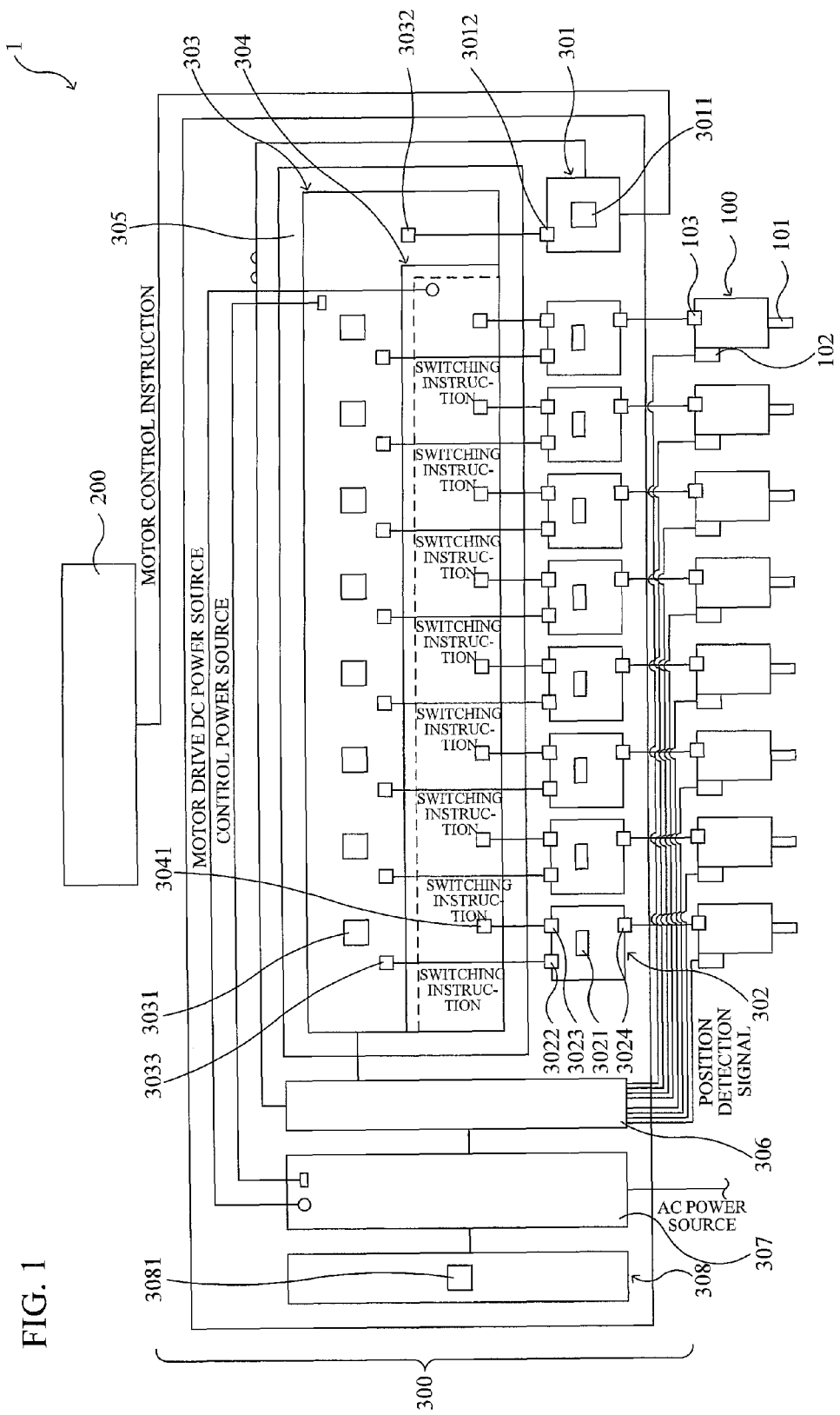
FIG. 1 is a system configuration diagram conceptually showing an entire configuration of a multi-axis motor drive system in an embodiment.

As shown in FIG. 1, a multi-axis motor drive system 1 of the present embodiment includes eight motors 100 outputting rotational power, a controller 200 (master controller) outputting a motor control instruction, and a multi-shaft motor drive device 300 driving each of the motors 100 according to the motor control instruction of the controller 200.

Each of the motors 100 includes an encoder 102 outputting a position detection signal by detecting a rotational angle of a rotational body such as a rotational axis 101.

The multi-shaft motor drive device 300 includes a case (illustration is omitted) configuring the contour thereof and also, within this case, includes a relay substrate 306, a converter module 307, a condenser module 308, a control module 301, one to eight amplifier modules 302 supplying power to the motor 100 and driving the motor 100, a control substrate 303, a power substrate 304 which is a substrate different from the control substrate 303, and a common mount base 305 on which the control substrate 303 and the power substrate 304 are disposed separately from each other.

The converter module 307 inputs an AC power source (e.g., AC 200 V), and generates and outputs a motor drive DC power source (e.g., DC +300 V) and a control power source (e.g., DC +5 V or DC ±12 V).

The condenser module 308 mounts a condenser 3081. The condenser 3081 smoothes the motor drive DC power source generated by the converter module 307.

The relay substrate 306 inputs a position detection signal from the encoder 102 in each of the motors 100 and generates a corresponding signal to output it to the control module 301 and the control substrate 303.

The control module 301 mounts a CPU 3011. The CPU 3011 distributes and outputs the motor control instruction output from the controller 200 (instruction for any one of a position, speed, and torque) to eight control operation units 3031 (to be described below) on the control substrate 303.

Each of the amplifier modules 302 includes a connector 3024 which can detachably connect a connector (illustration is omitted) of a motor cable for connecting the motor 100. The connector on one side of the motor cable is fitted together with the connector 3024 and a connector on the other side is fitted together with a connector 103 of the motor 100, and thereby each of the amplifier modules 302 is connected with the motor 100. In this case, capacity (output amount) of each of the motors 100 connected to each of the amplifier modules 302 may be the same or may be different from one another. Each of the amplifier modules 302 is configured so as to have approximately the same external dimensions regardless of the capacity of the corresponding motor 100. Namely, in the embodiment, means for supplying power to the motor recited in the claims consists of the amplifier modules 302.

The control substrate 303 has a stacked structure of multi-layers (e.g., 10 layers), and inputs the control power source from the converter module 307. This control substrate 303 includes the eight control operation units 3031 (control ICs), eight connectors 3033 which can arrange in parallel and detachably connect the amplifier modules 302, and a connector 3032 which can detachably connect the control module 301 disposed in parallel with the amplifier modules 302. Then, a connector 3022 in each of the amplifier modules 302 is fitted together with each of the connectors 3033 and thereby the control substrate 303 is connected with each of the amplifier modules 302, and a connector 3012 of the control module 301 is fitted together with the connector 3032 and thereby the control substrate 303 is connected with the control module 301.

Each of the control operation units 3031 is configured with an IC chip, for example, and corresponds to one motor. Each of these control operation units 3031 inputs the motor control instruction from the controller 200 which is distributed and input by the CPU 3011 in the control module 301 and the position detection signal from the encoder 102 in each of the motors 100, and executes control operation (including current control operation) according to the input motor control instruction. Then, each of the control operation units 3031 outputs a switching instruction according to this control operation to a switching element 3021 included in the amplifier module 302 which is connected to the control substrate 303 via the connector 3033.

Further, in the control substrate 303, there is disposed a signal line (illustration is omitted) for controlling the switching element 3021 in each of the amplifier modules 302 which is connected via each of the connectors 3033, according to the motor control instruction from the controller 200 which is distributed and input by the CPU 3011 in the control module 301 which is connected via the connector 3032. That is, in the control substrate 303, there is disposed a signal line of a low voltage system (e.g., DC +5 V, DC ±12 V, or the like) which is used for signal transmission or reception for controlling each of the amplifier modules 302. Namely, in the embodiment, means for disposing a signal line to control the means for supplying power to the motor consists of the control substrate 303.

The power substrate 304 has a stacked structure of multilayers (e.g., 4 layers), and inputs the motor drive DC power source from the converter module 307. This power substrate 304 includes eight connectors 3041 which arrange in parallel and detachably connect the amplifier modules 302. A connector 3023 in each of the amplifier modules 302 is fitted together with each of the connectors 3041 and thereby the power substrate 304 is connected with each of the amplifier modules 302. Further, in the power substrate 304, there is disposed a power line (illustration is omitted) for supplying power to each of the amplifier modules 302 connected via each of the connectors 3041. That is, in the power substrate 304, there is disposed a power line of a high voltage system (e.g., DC +300 V or the like) which is supplied to each of the amplifier modules 302. Namely, in the embodiment, means for disposing a power line to supply power to the means for supplying power to the motor consists of the power substrate 304.

Figure 2:
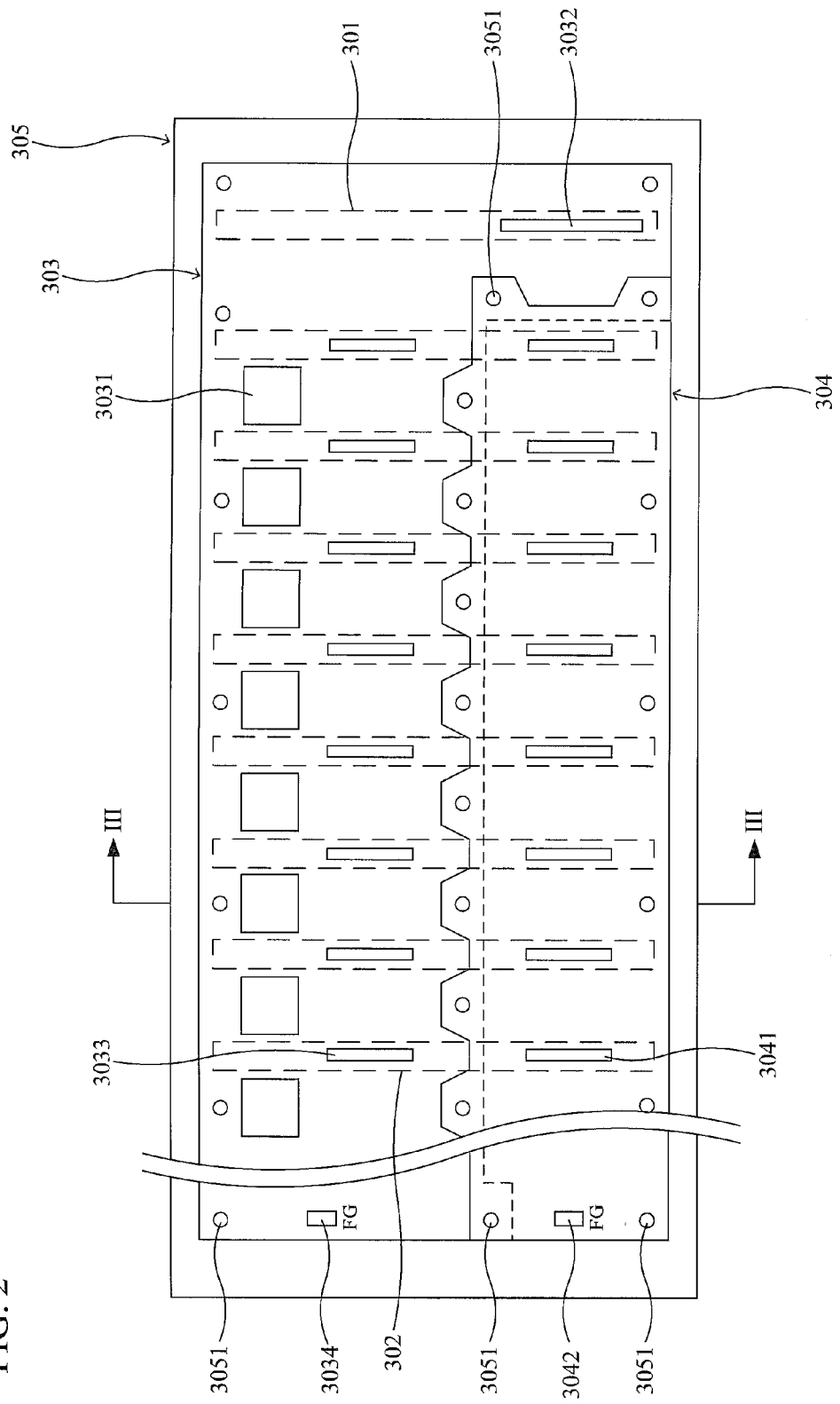
FIG. 2 is an explanatory diagram conceptually showing a configuration of a control substrate and a power substrate disposed on a mount base.
Figure 3:
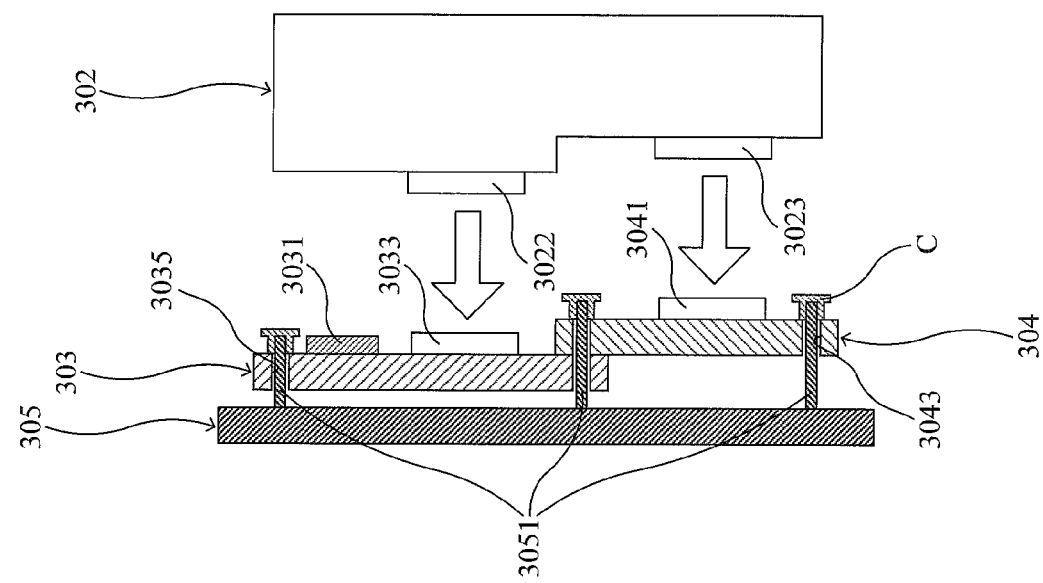
FIG. 3 is a transverse cross-sectional diagram along the III-III cross section of FIG. 2.

As shown in FIG. 2 and FIG. 3, the mount base 305 has an approximately rectangular shape in a planar view, and plural pins 3051 are erected on the surface thereof (face on the front side of the page in FIG. 2 and face on the right side in FIG. 3). Further, the control substrate 303 has an approximately L-shape in the planar view and plural through-holes 3035 (first through-holes) are provided in an edge part thereof (refer to FIG. 3). Further, the power substrate 304 has an approximately rectangular shape in the planar view and plural through-holes 3043 (second through-holes) are provided in an edge part thereof (refer to FIG. 3). Here, in edge parts of the power substrate 304, there is an edge part having a concavo-convex shape in the planar view, and, in this edge part having the concavo-convex shape in the planar view, the above through-hole 3043 is provided in a part having a convex shape in the planar view.

Then, each of the pins 3051 erected on the mount base 305 is inserted through each of the through-holes 3035 and 3043 and thereby the control substrate 303 and the power substrate 304 are positioned and disposed on the mount base 305 separately from each other, in a state in which the edge part of the control substrate 303 and the edge part of the power substrate 304 are overlapped partially, in detail, in a state in which the through-holes 3035 provided in the edge part of the control substrate 303 and the through-holes 3043 provided in the edge part having the convex shape in the planar view in the power substrate 304 are overlapped. Note that the control substrate 303 and the power substrate 304 may be positioned and disposed on the mount base 305 separately from each other in a state without overlapping. Further, the head in each of the pins 3051 inserted through each of the through-holes 3035 and 3043 protrudes from each of the through-holes 3035 and 3043 and a cap C is attached to the head in each of the protruding pins 3051, and thereby the control substrate 303 and the power substrate 304 are fixed to the mount base 305 (note that a state omitting the cap C is shown in FIG. 2). Note that the head in each of the pins 3051 inserted through each of the through-holes 3035 and 3043 may be caused not to protrude from each of the through-holes 3035 and 3043 and also the control substrate 303 and the power substrate 304 may be fixed to the mount base 305 by means of providing an internal thread on the head side in each of the pins 3051 and screwing a male screw into each of the internal threads.

That is, it can be said that, among the plural pins 3051 erected on the mount base 305, the pin 3051 inserted through the through-holes 3035 and 3043 positions the relative positions of the control substrate 303 and the power substrate 304 in the state in which the through-holes 3035 and 3043 are overlapped as described above when the control substrate 303 and the power substrate 304 are disposed on the mount base 305. Accordingly, among the plural pins 3051 erected on the mount base 305, the pin 3051 inserted through the through-holes 3035 and 3043 in the state in which the through-holes 3035 and 3043 are overlapped as described above when the control substrate 303 and the power substrate 304 are disposed on the mount base 305 corresponds to the first protrusion part and also the positioning part which are described in claims. Further, in the embodiment, means for disposing the means for disposing a signal line and the means for disposing a power line separately from each other consists of the pins 3051.

The control substrate 303 and the power substrate 304 are fixed to the mount base 305 as described above in the state after the positioning has been performed, and thereby the connectors 3022 and 3023 of the amplifier module 302 can be fitted together with the connector 3033 of the control substrate 303 and the connector 3041 of the power substrate 304, respectively, and the amplifier module 302 is configured to be connected to the control substrate 303 and the power substrate 304. Here, in FIG. 2, the one to eight amplifier modules 302 connected to the control substrate 303 and the power substrate 304 and the control module 301 connected to the control substrate 303 are shown by supposed lines (broken lines). Note that in FIG. 2, a part of the components shown in FIG. 1 is omitted from illustration.

Further, as shown in FIG. 2, the power substrate 304 includes a common FG (Frame Ground) terminal 3042 which corresponds to each of the one to eight amplifier modules 302 connected via the eight connectors 3041, and the power substrate 304 is earthed via this FG terminal 3042. Accordingly, without pulling out a FG wiring from each of the one to eight amplifier modules 302 and earthing each thereof, it is possible to save wirings by performing the earthing in a concentrated manner at one position in the FG terminal 3042 of the power substrate 304. Further, the control substrate 303 includes an FG terminal 3034 separated from the above FG terminal 3042 on the side of the power substrate 304, and the control substrate 303 is earthed via this FG terminal 3034. By separating the FG terminal 3034 of the control substrate 303 from the FG terminal 3042 of the power substrate 304 and disposing each of the FG terminals 3034 and 3042 independently, it is possible to reduce influence of noise which the signal line of the control substrate 303 receives from the power line of the power substrate 304.

Further, each of the control operation units 3031 provided on the control substrate 303 is provided on the face of the control substrate 303 opposite to the side of the mount base 305, that is, on the surface (face on the front side of the page in FIG. 2 and face on the right side in FIG. 3) of the control substrate 303.

As explained above, the multi-axis motor drive system 1 of the present embodiment includes the eight motors 100, the controller 200, and the multi-shaft motor drive device 300. The multi-shaft motor drive device 300 includes the control module 301, the one to eight amplifier modules 302, the control substrate 303, and the power substrate 304. The signal line of the low voltage system used for signal transmission and reception of the control signal is disposed on the control substrate 303, and the power line of the high voltage system supplying power to each of the amplifier modules 302 is disposed on the power substrate 304. Then, the control substrate 303 and the power substrate 304 are configured to be separated from each other. Thereby, the power line of the high voltage system and the signal line of the low voltage system can be disposed separately on the different substrates, and it is possible to avoid the state that wirings of different voltage systems are mixed on one substrate and resultantly it is possible to improve reliability for insulation, noise, and the like.

Further, since it is necessary to secure a larger insulation distance and surface distance between wiring patterns and mounted components in the high voltage system than in the low voltage system, if these systems exist in a mixed state, the substrate becomes unnecessarily large and the multi-shaft motor drive device 300 is invited to have a larger size. On the other hand, in the present embodiment, the high voltage system and the low voltage system are disposed separately on the different substrates and thereby it becomes possible to reduce the entire size of the multi-shaft motor drive device 300 by appropriately setting the number of stacked layers in the substrate in consideration of a circuit arrangement and a substrate area on each of the control substrate 303 and the power substrate 304, while easily securing a predetermined insulation distance and surface distance on the power substrate 304. Further, since the control substrate 303 and the power substrate 304 are separated from each other, it becomes possible to design the number of stacked layers which is suitable for the number of shafts and the substrate area, individually for the substrates, and it is possible to improve design freedom.

Further, particularly in the present embodiment, an advantage can be obtained as follows. That is, generally it is known that the switching element 3021 in the amplifier module 302 generates heat and switching noise (radiation noise) when the motor 100 is driven, and these heat and noise cause erroneous operation in the control IC. Accordingly, in the present embodiment, the control substrate 303 is configured including the control operation unit 3031. Thereby, the control operation unit 3031 can be disposed separately from the amplifier module 302. As a result, it is possible to suppress that the control operation unit 3031 receives the influence of the heat and the noise generated in the amplifier module 302, and thereby it is possible to improve operation stability and reliability of the multi-shaft motor drive device 300.

Further, particularly in the present embodiment, the control substrate 303 and the power substrate 304 include the connector 3033 and 3041, respectively, which can arrange in parallel and detachably connect the amplifier modules 302 and are connected with the amplifier modules 302 via the connector 3033 and 3041. Since the control substrate 303 and the power substrate 304 include the connectors 3033 and 3041 which can arrange in parallel and detachably connect the amplifier modules 302, it is possible to attach or detach the amplifier modules 302 according to the number of the motors 100 to be used and to increase or decrease the number thereof easily.

Further, particularly in the present embodiment, the multi-shaft motor drive device 300 includes the common mount base 305 where the control substrate 303 and the power substrate 304 are disposed, and the mount base 305 includes the pins 3051 which positions the relative positions of the control substrate 303 and the power substrate 304. Since the mount base 305 includes the pins 3051, it is possible to easily position the control substrate 303 and the power substrate 304 so as to cause the connectors 3033 and 3041 in the respective substrates for connecting the amplifier modules 301 to have corresponding positions when the control substrate 303 and the power substrate 304 are disposed on the mount base 305.

Further, particularly in the present embodiment, the through-hole 3035 is provided in the edge part of the control substrate 303 and also the through-hole 3043 is provided in the edge part of the power substrate 304, and the pin 3051 erected on the mount base 305 is inserted through the through-holes 3035 and 3043 in the overlapped state, and thereby the control substrate 303 and the power substrate 304 are positioned. Thereby, it is possible to position the control substrate 303 and the power substrate 304 easily in a high accuracy so as to cause the connectors 3033 and 3041 to have the corresponding positions.

Further, particularly in the present embodiment, the amplifier module 302 is configured to have approximately the same external dimensions regardless of the capacity of the corresponding motor 100. Thereby, also when the plural motors 100 having different motor capacities are used, it is possible to accommodate to this case by using one case and one mount base 305 in the multi-shaft motor drive device 300. Accordingly, it is possible to realize space saving and cost saving.

Note that an embodiment is not limited to the above contents and can be modified variously in the range without departing from the gist and technical idea thereof. Hereinafter, such variation examples will be explained sequentially.

(1) Case of Disposing the Control Operation Unit in Contact with the Mount Base

Figure 4:
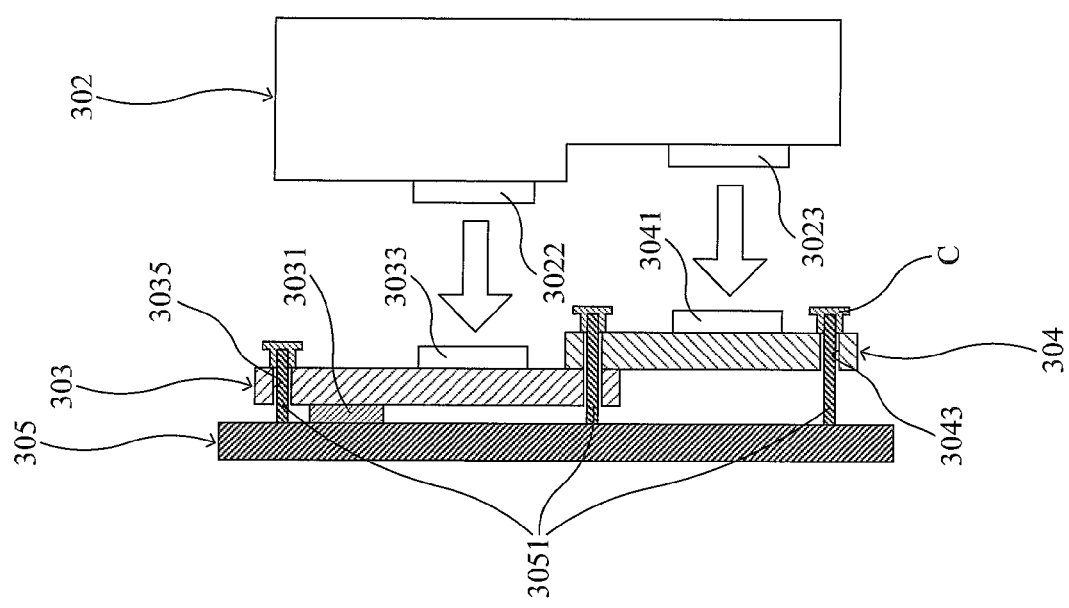
FIG. 4 is an explanatory diagram explaining a disposition position of a control operation unit in a variation example in which the control operation unit is disposed contacting a mount base.

While, in the above embodiment, each of the control operation units 3031 provided on the control substrate 303 is disposed on the face of the control substrate 303 opposite to the side of the mount base 305, an embodiment is not limited to this case. That is, as shown in FIG. 4, each of the control operation units 3031 provided on the control substrate 303 may be disposed on the face of the control substrate 303 on the side of the mount base 305, that is, the rear face (face on the left side in FIG. 4) of the control substrate 303, so as to contact the mount base 305.

Also in this case, it is possible to obtain the same advantage as that of the above described embodiment. By such a configuration, it is possible to conduct the heat generated by the switching operation of the control operation unit 3031 to the mount base 305 and dissipate the heat efficiently.

(2) Case of Providing a Guide for the Amplifier Module

That is, for the amplifier module 302, there may be provided a guide for smoothly fitting the connectors 3033 and 3041 of the control substrate 303 and the power substrate 304 together with the connectors 3022 and 3023 of the amplifier module 302.

Figure 5:
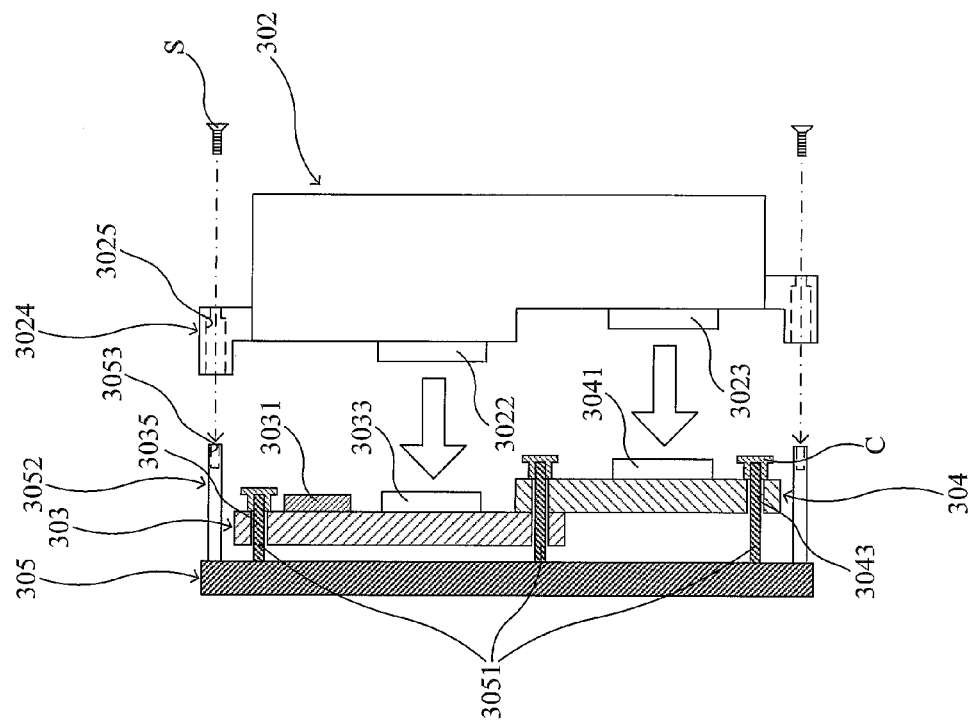
FIG. 5 is an explanatory diagram explaining a method of connecting an amplifier module to a control substrate and a power substrate in a variation example in which a guide is provided at the amplifier module.

As shown in FIG. 5, there are erected plural guide pins 3052 (second protrusion part) in an edge part of the surface (face on the right side in FIG. 5) of the mount base 305 in the present variation example. An internal thread 3053 is provided on the head side of each of the guide pins 3052. Further, in the upper edge part (upper edge part in FIG. 5) and in the lower edge part (lower edge part in FIG. 5) of each of the amplifier modules 302 in the present variation example, there are provided through-holes 3025 (third through-holes) and a guide 3024 (guide part) which can fix the amplifier module 302 to the mount base 305 by means of screwing a male screw S into the internal thread 3053 of the guide pin 3052 after the guide pin 3052 has been inserted through the through-hole 3025. Then, the amplifier module 302 is fixed to the mount base 305 with these guide pin 3052 and the guide 3024. Accordingly, the guide pin 3052 and the guide 3024 configure the fixing part described in claims.

That is, when the amplifier module 302 is connected to the control substrate 303 and the power substrate 304, first each of the guide pins 3052 erected on the mount base 305 and the through-hole 3025 of each of the guides 3024 provided for the amplifier module 302 are fitted together with each other, for smoothly fitting the connectors 3033 and 3041 of the control substrate 303 and the power substrate 304 together with the connectors 3022 and 3023 of the amplifier module 302. Subsequently, the connectors 3033 and 3041 of the control substrate 303 and the power substrate 304 and the connectors 3022 and 3023 of the amplifier module 302 are fitted together with each other, and thereby the control substrate 303 and the power substrate 304 are connected with the amplifier module 302. Then, the male screw S is screwed into the internal thread 3053 of the guide pin 3052 which is inserted through the through-hole 3025 in each of the guides 3024, and thereby the amplifier module 302 is fixed to the mount base 305. Here, as in the above described embodiment, the head in each of the guide pins 3052 which is inserted through the through-hole 3025 in each of the guides 3024 may be caused to protrude from each of the through-holes 3025 and a cap may be attached to the head in each of the protruding guide pins 3052, and thereby the amplifier module 302 may be fixed to the mount base 305.

Also in the present variation example, it is possible to obtain the same advantage as that of the above described embodiment. Further, by fixing the amplifier module 302 to the mount base 305 using the guide pin 3052 and the guide 3024, it is possible to smoothly fit the connectors 3033 and 3041 of the control substrate 303 and the power substrate 304 together with the connectors 3022 and 3023 of the amplifier module 302. Further, it is possible to fix the amplifier module 302 more securely to the mount base 305 by means of fixing the amplifier module 302 to the mount base 305 by screwing the male screw S into the internal thread 3053 of the guide pin 3052 after the guide pin 3052 has been inserted through the through-hole 3025 of the guide 3024.

(3) Others

While, in the above, the case of providing the one to eight amplifier modules 302 for the multi-shaft motor drive device 300 has been explained, the number of the amplifier modules is not limited to this number and may be nine or larger.

Further, other than the examples already described above, the methods according to the above embodiment and each of the variation examples may be combined appropriately for utilization.

For the others, although each example is not illustrated, the above embodiment and each of the variation examples are carried out after various modifications have been provided in the range without departing from the gist thereof.

What is claimed is:

1. A multi-shaft motor drive device, comprising:
   a control substrate including at least one connector;
   a power substrate including at least one connector;
   at least one amplifier module including one connector directly fitted to the connector of the control substrate and another connector directly fitted to the connector of the power substrate, the at least one amplifier module being erected on the control substrate and the power substrate, the at least one amplifier module being configured to supply power to at least one motor; and
   a positioning part configured to position relative positions of the control substrate and the power substrate in such a manner that the two connectors of the amplifier module can be directly connected to the connector of the control substrate and the connector of the power substrate, respectively,
   wherein the positioning part is a pin that extends within a through-hole on the control substrate and within a through-hole on the power substrate.

2. The multi-shaft motor drive device according to claim 1, wherein:
   the amplifier module comprises a switching element,
   the control substrate is provided with a signal line disposed for controlling the switching element according to a motor control instruction from a master controller, and
   the power substrate is provided with a power line disposed for supplying power to the amplifier module.

3. A multi-shaft motor drive device, comprising:
   a control substrate including at least one connector;
   a power substrate including at least one connector;
   at least one amplifier module including one connector directly fitted to the connector of the control substrate and another connector directly fitted to the connector of the power substrate, the at least one amplifier module being erected on the control substrate and the power substrate, the at least one amplifier module being configured to supply power to at least one motor;
   a single common mount base on which the control substrate and the power substrate are disposed; and
   at least one positioning part disposed on the mount base, the at least one positioning part being configured to position relative positions of the control substrate and the power substrate in such a manner that the two connectors of the amplifier module can be directly connected to the connector of the control substrate and the connector of the power substrate, respectively,
   wherein the at least one positioning part is a pin that is erected on the mount base, the pin extends from the mount base within a through-hole on the control substrate and within a through-hole on the power substrate.

4. The multi-shaft motor drive device according to claim 3, wherein:
- the control substrate includes a first through-hole in an edge part of the control substrate,
- the power substrate includes a second through-hole in an edge part of the power substrate,
- the positioning part includes a first protrusion part which is erected on the mount base and inserted through the first through-hole and the second through-hole in a state that the first through-hole and the second through-hole are overlapped with each other.

5. The multi-shaft motor drive device according to claim 4, wherein:
- a control IC mounted is arranged on the control substrate and is provided on a face of the control substrate on a side of the mount base so as to contact the mount base.

6. The multi-shaft motor drive device according to claim 5, further comprising
- at least one fixing part configured to fix the amplifier module to the mount base, wherein the at least one fixing part includes:
  - a second protrusion part erected on the mount base,
  - an internal thread provided at the second protrusion part,
  - a guide part provided at the amplifier module, and
  - a third through-hole provided at the guide part, and wherein
- the amplifier module is configured to be capable of being fixed to the mount base by screwing a male screw into the internal thread after inserting the second protrusion part through the third through-hole.

* * * * *